US008274143B2

(12) United States Patent
Fujishima et al.

(10) Patent No.: US 8,274,143 B2

(45) Date of Patent: Sep. 25, 2012

(54) SEMICONDUCTOR DEVICE, METHOD OF FORMING THE SAME, AND ELECTRONIC DEVICE

(75) Inventors: Hiroyuki Fujishima, Tokyo (JP); Keiyo Kusanagi, Tokyo (JP); Katsumi Sugawara, Tokyo (JP); Koichi Hatakeyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 84 days.

(21) Appl. No.: 12/662,333

(22) Filed: Apr. 12, 2010

(65) Prior Publication Data

US 2010/0258933 A1 Oct. 14, 2010

(30) Foreign Application Priority Data

Apr. 13, 2009 (JP) ............................... P2009-097036

(51) Int. Cl.
*H01L 25/065* (2006.01)
*H01L 23/522* (2006.01)

(52) U.S. Cl. ........ 257/686; 257/621; 257/685; 257/690; 257/777; 257/790; 257/E23.013; 257/E23.067

(58) Field of Classification Search .................. 257/621, 257/685, 686, 690, 777, 790, E23.013, E23.067, 257/E23.141, E23.126
See application file for complete search history.

(56) References Cited

U.S. PATENT DOCUMENTS

| | | | | |
|---|---|---|---|---|
| 7,279,366 | B2 * | 10/2007 | Bolken | 438/125 |
| 7,372,137 | B2 | 5/2008 | Saeki | |
| 7,638,362 | B2 | 12/2009 | Ishino et al. | |
| 7,679,175 | B2 | 3/2010 | Saeki | |
| 2002/0043658 | A1 * | 4/2002 | Mess et al. | 257/2 |
| 2004/0135242 | A1 * | 7/2004 | Hsin | 257/686 |
| 2005/0017340 | A1 * | 1/2005 | Shibue | 257/686 |
| 2005/0189639 | A1 * | 9/2005 | Tanie et al. | 257/686 |
| 2006/0231928 | A1 * | 10/2006 | Dotta et al. | 257/621 |
| 2008/0128916 | A1 * | 6/2008 | Soejima et al. | 257/777 |

FOREIGN PATENT DOCUMENTS

| | | |
|---|---|---|
| JP | 2006-269861 | 10/2006 |
| JP | 2006-319243 | 11/2006 |
| JP | 2007-66932 | 3/2007 |

* cited by examiner

*Primary Examiner* — Peniel M Gumedzoe
(74) *Attorney, Agent, or Firm* — McGinn IP Law Group, PLLC

(57) ABSTRACT

A semiconductor device includes a substrate, a stack of semiconductor chips, and a first sealing material. The substrate may include, but is not limited to, a chip mounting area and a higher-level portion. The higher level portion surrounds the chip mounting area. The higher-level portion is higher in level than the chip mounting area. The stack of semiconductor chips is disposed over the chip mounting area. A first sealing material seals the stack of semiconductor chips. The first sealing material is confined by the higher-level portion.

21 Claims, 14 Drawing Sheets

44 41 41 26a 24b 45 40 45 42 24a 42 48 38a 46 38 24 22 22 26 20 30 22 28 34 12a 34a 36 16 12 22a 22a 32 14 22 18 34a

SEMICONDUCTOR DEVICE, METHOD OF FORMING THE SAME, AND ELECTRONIC DEVICE

BACKGROUND OF THE INVENTION

1. Field of the Invention

The present invention relates to a semiconductor device, a method of forming the same, and an electronic device. More particularly, the present invention relates to a semiconductor device which includes a chip stacked structure, a method of forming the same, and an electronic device.

Priority is claimed on Japanese Patent Application No. 2009-097036, filed Apr. 13, 2009, the content of which is incorporated herein by reference.

2. Description of the Related Art

Recently, a chip on chip (COC) semiconductor device including a stack of a plurality of chips has been developed in order to reduce the mounting area. Such a COC semiconductor chip is disclosed in Japanese Unexamined Patent Application, First Publications, Nos. JP-A-2006-269861 and JP-A-2007-66932.

The COC-type semiconductor device disclosed in Japanese Unexamined Patent Application, First Publications, Nos. JP-A-2006-269861 and JP-A-2007-66932 includes a lower wiring board, a wiring board, a chip stacked structure, an upper substrate and a sealing member. The wiring board has wirings. A chip stacked structure is a stack of semiconductor chips connected to each other through penetration electrodes. An upper substrate is disposed over the chip stacked structure. A sealing member is disposed between the lower wiring board and the upper substrate to seal the semiconductor chips.

Japanese Unexamined Patent Application, First Publication, No. JP-A-2006-319243 discloses that the COC-type semiconductor device uses a radiator plate as a supporting member.

Japanese Unexamined Patent Application, First Publication, No. JP-A-2006-319243 discloses that a mold resin can not fully enter into the chip stacked structure. In order to prevent voids, an underfill material fills gaps in the chip stacked structure before the mold resin is formed.

Japanese Unexamined Patent Application, First Publication, No. JP-A-2006-319243 discloses injecting the underfill material to the chip stacked structure, as shown in FIG. 28A. Before an underfill material 134 fills gaps of the chip stacked structure 120, the underfill material 134 is spread on an upper surface 12*a* of a metallic plate 112. The shape of a fillet portion 134*a* becomes unstable. Then, as shown in FIG. 28B, if a resin sealing member 136 is formed to cover the underfill material 134, a void B may be formed between semiconductor chips 122 and 122 which form the chip stacked structure 120. As the void B is generated, cracks or the like are generated in a reflow process. The reliability of a semiconductor device becomes reduced.

SUMMARY

In one embodiment, a semiconductor device may include, but is not limited to, a substrate, a stack of semiconductor chips, and a first sealing material. The substrate may include, but is not limited to, a chip mounting area and a higher-level portion. The higher level portion surrounds the chip mounting area. The higher-level portion is higher in level than the chip mounting area. The stack of semiconductor chips is disposed over the chip mounting area. A first sealing material seals the stack of semiconductor chips. The first sealing material is confined by the higher-level portion.

In another embodiment, a semiconductor device may include, but is not limited to, a substrate, a stack of semiconductor chips, and a first sealing material. The substrate has a first flat surface and a confining surface. The stack of semiconductor chips is disposed over the flat surface. The first sealing material seals the stack of semiconductor chips. The first sealing material is confined by the confining surface.

In still another embodiment, a semiconductor device may include, but is not limited to, a substrate, a stack of semiconductor chips, and a sealing material. The substrate may include, but is not limited to, a chip mounting portion and an overflow stopper. The overflow stopper surrounds the chip mounting portion. The stack of semiconductor chips is disposed over the chip mounting portion. The sealing material seals the stack of semiconductor chips. The sealing material is confined by the overflow stopper.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
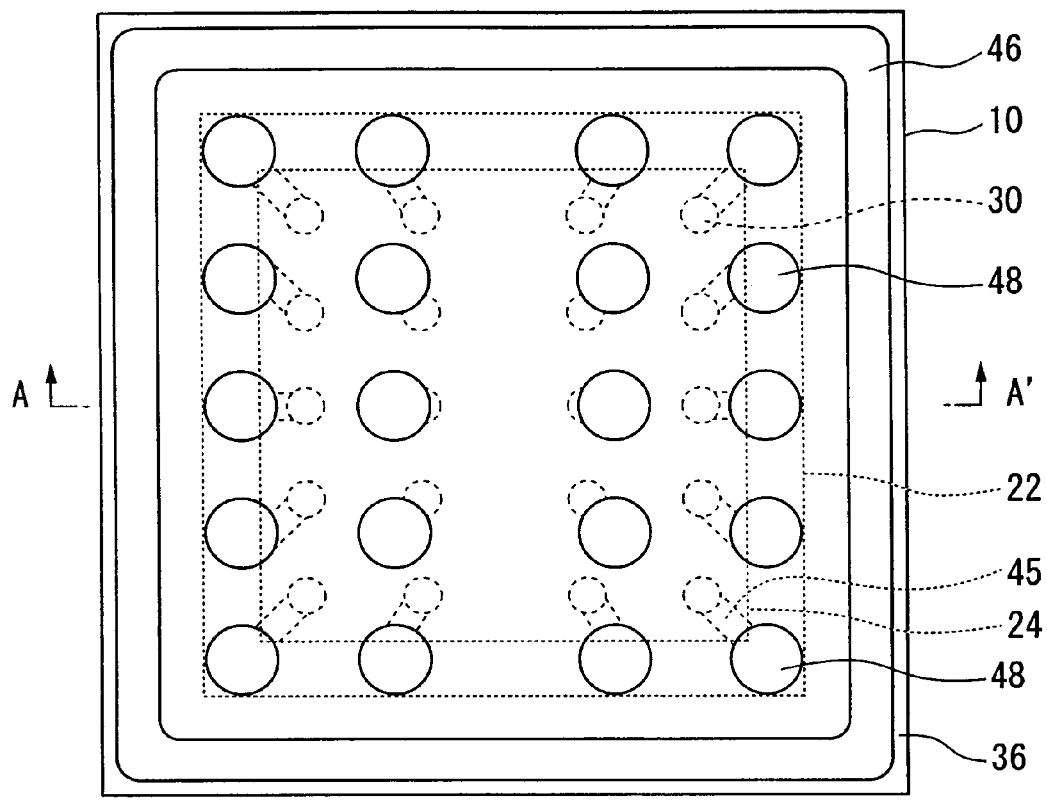
FIG. 1 is a plan view illustrating a COC-type semiconductor device according to a first embodiment of the invention.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

In one embodiment, a semiconductor device may include, but is not limited to, a substrate, a stack of semiconductor chips, and a first sealing material. The substrate may include, but is not limited to, a chip mounting area and a higher-level portion. The higher level portion surrounds the chip mounting area. The higher-level portion is higher in level than the chip mounting area. The stack of semiconductor chips is disposed over the chip mounting area. A first sealing material seals the stack of semiconductor chips. The first sealing material is confined by the higher-level portion.

In some cases, the higher-level portion may have a confining surface that confines a fillet portion of the first sealing material.

In some cases, the confining surface may include, but is not limited to, at least one of a sloped surface and a vertical surface.

In some cases, the substrate may include, but is not limited to, a lower-level portion having the chip mounting area and the higher-level portion. The higher-level portion surrounds the lower-level portion. The higher-level portion has a confining surface that confines the first sealing material.

In some cases, the higher-level portion may be thicker than the lower-level portion.

In some cases, the higher-level portion may be made of the same material as that of the lower-level portion.

In other cases, the higher-level portion may include, but is not limited to, a projecting member which projects from the surface of the substrate.

In other cases, the projecting member may be made of a material different from that of the substrate.

In some cases, the semiconductor device may further include, but is not limited to, a second sealing material that covers the first sealing material.

In some cases, the higher-level portion may have an outside edge that is aligned to an outside edge of the second sealing material.

In some cases, the semiconductor device may further include, but is not limited to, a wiring board eclectically connected to the stack of semiconductor chips. The stack of semiconductor chips is disposed between the wiring board and the substrate.

In some cases, the stack of semiconductor chips may include, but is not limited to, semiconductor chips which each have through electrodes. The semiconductor chips are electrically connected to each other via the through electrodes.

In some cases, the stack of semiconductor chips may include, but is not limited to, a plurality of memory chips and an interface chip which controls the plurality of memory chips.

In another embodiment, a semiconductor device may include, but is not limited to, a substrate, a stack of semiconductor chips, and a first sealing material. The substrate has a first flat surface and a confining surface. The stack of semiconductor chips is disposed over the flat surface. The first sealing material seals the stack of semiconductor chips. The first sealing material is confined by the confining surface.

In some cases, the confining surface may include, but is not limited to, at least one of a sloped surface and a vertical surface.

In some cases, the substrate may include, but is not limited to, a second flat surface which is connected through the confining surface to the first flat surface.

In some cases, the semiconductor device may further include, but is not limited to, a second sealing material which covers the first sealing member and the second flat surface.

In some cases, the substrate may include, but is not limited to, a projecting member that surrounds the first flat surface, and the projecting member has the confining surface.

In still another embodiment, a semiconductor device may include, but is not limited to, a substrate, a stack of semiconductor chips, and a sealing material. The substrate may include, but is not limited to, a chip mounting portion and an overflow stopper. The overflow stopper surrounds the chip mounting portion. The stack of semiconductor chips is disposed over the chip mounting portion. The sealing material seals the stack of semiconductor chips. The sealing material is confined by the overflow stopper.

In some cases, the overflow stopper may have a confining surface confining a fillet portion of the sealing material.

In yet another embodiment, an electronic device that includes, but is not limited to a semiconductor device. The semiconductor device may include, but is not limited to, a substrate, a stack of semiconductor chips, and a first sealing material. The substrate may include, but is not limited to, a chip mounting area and a higher-level portion. The higher level portion surrounds the chip mounting area. The higher-level portion is higher in level than the chip mounting area. The stack of semiconductor chips is disposed over the chip mounting area. A first sealing material seals the stack of semiconductor chips. The first sealing material is confined by the higher-level portion.

In an additional embodiment, an electronic device that includes, but is not limited to a semiconductor device. The semiconductor device may include, but is not limited to, a substrate, a stack of semiconductor chips, and a first sealing material. The substrate has a first flat surface and a confining surface. The stack of semiconductor chips is disposed over the flat surface. The first sealing material seals the stack of semiconductor chips. The first sealing material is confined by the confining surface.

In a further additional embodiment, an electronic device that includes, but is not limited to a semiconductor device. The semiconductor device may include, but is not limited to, a substrate, a stack of semiconductor chips, and a sealing material. The substrate may include, but is not limited to, a chip mounting portion and an overflow stopper. The overflow stopper surrounds the chip mounting portion. The stack of semiconductor chips is disposed over the chip mounting portion. The sealing material seals the stack of semiconductor chips. The sealing material is confined by the overflow stopper.

In a furthermore additional embodiment, a method of forming a semiconductor device may include, but is not limited to, the following processes. A substrate is prepared, which has a chip mounting portion and an overflow stopper. The overflow stopper surrounds the chip mounting portion. A stack of semiconductor chips is formed over the chip mounting portion. A nonsolid first sealing material is supplied to seal the stack of semiconductor chips, while the overflow stopper confining the nonsolid first sealing material within the chip mounting portion. The method may further include, but is not limited to, thermosetting the nonsolid first sealing material. The substrate may be prepared by selectively etching the substrate except for a side portion thereof, thereby forming the chip mounting portion and the overflow stopper that surrounds the chip mounting portion. The substrate may be prepared by providing a projecting member on a side portion of the surface of the substrate. The stack of semiconductor chips is formed by stacking semiconductor chips over the chip mounting portion. The stack of semiconductor chips is formed by preparing the stack of semiconductor chips and then providing the stack of semiconductor chips over the chip mounting portion. The method may further include, but is not limited to, providing a wiring board on the stack of semiconductor chips, so that the stack of semiconductor chips is disposed between the substrate and the wiring board.

Hereinafter, a semiconductor device according to a first embodiment of the invention will be described with reference to the accompanying drawings.

Figure 2:
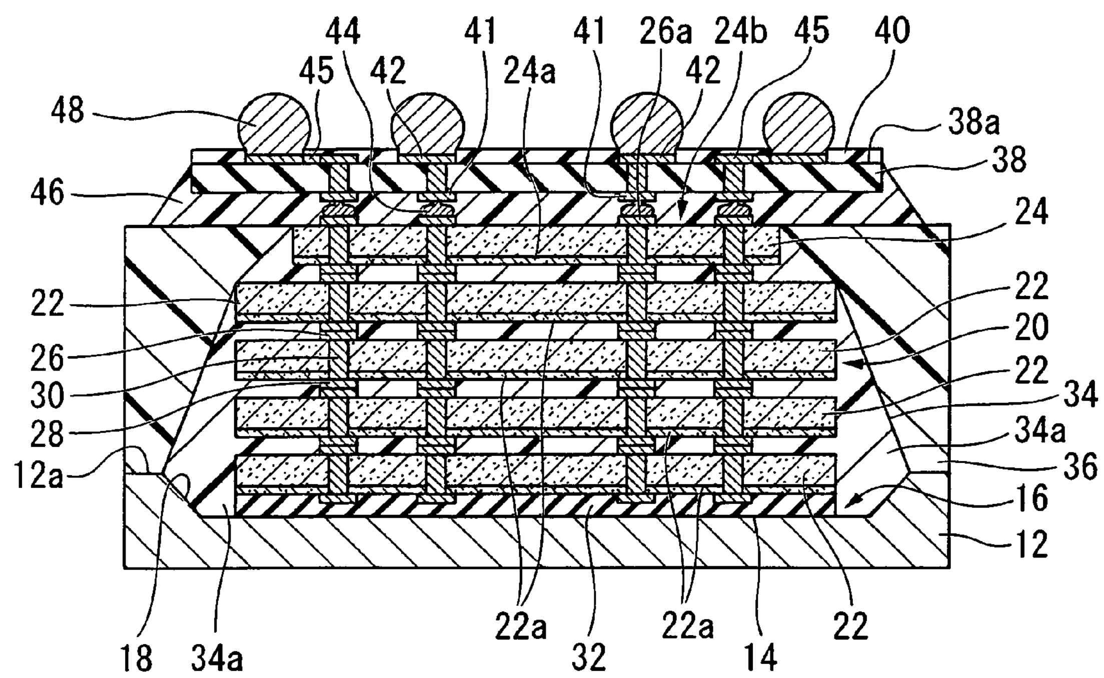
FIG. 2 is a sectional view illustrating the COC-type semiconductor device, taken along an A-A' line in FIG. 1.

FIG. 1 is a plan view illustrating a COC-type semiconductor device according to the first embodiment of the invention. FIG. 2 is a sectional view illustrating the COC-type semiconductor device, taken along an A-A' line in FIG. 1.

A COC-type semiconductor device 10 may include, but is not limited to, a metal substrate 12 of a generally rectangular shape. The metal substrate 12 may be made of, but is not limited to, an alloy 42 which may be an iron nickel alloy. The metal substrate 12 may have a thickness of, for example, 0.2 mm. The metal substrate 12 has a main surface 12*a*. The metal substrate 12 has a lower-level portion 16 and a higher-level portion 18. The higher-level portion 18 surrounds the lower-level portion 16 in plan view. The higher-level portion 18 may extend along the sides of the metal substrate 12. The lower-level portion 16 may be surrounded by the higher-level portion 18. The surface of the lower-level portion 16 is lower in level than the higher-level portion 18.

The higher-level portion 18 may perform as an overflow stopper that stops overflow of a sealing material to outside the metal substrate 12. The higher-level portion 18 may have a top surface and a confining surface that confines the sealing material. In some cases, the confining surface may be a sloped surface. In other cases, the confining surface may be a vertical surface. The confining surface connects between the top surface of the higher-level portion 18 and the surface of the higher-level portion 18. The lower-level portion 16 is smaller in thickness than the higher-level portion 18.

As described above, the lower-level portion 16 of the metal substrate 12 provides a chip mounting area 14 on which the chip stacked structure 20 is mounted. The thickness of the lower-level portion 16 of the metal substrate 12 is smaller than other portions of the metal substrate 12. The thickness of the lower-level portion 16 may be, for example, about 0.1 mm. The higher-level portion 18 performs as the sealing material overflow stopper. The higher-level portion 18 has a sloped surface which connects between the top surface of the metal substrate 12 and the lower-level portion 16. The lower-level portion 16 is formed in the main surface 12*a* of the metal substrate 12. The chip mounting area 14 is formed in the lower-level portion 16. The higher-level portion 18 is formed around the chip mounting area 14. The sealing material overflow stopper is formed of the same material as the substrate 12. The higher-level portion 18 may have a height enough to prevent a chip stacked structure sealing member 34 (first sealing member) from flowing over the higher-level portion 18 to outside the substrate 12. It is possible to modify the substrate 12 to have a vertical surface which connects between the top surface of the higher-level portion 18 and the lower-level portion 16.

The chip stacked structure 20 is mounted on the chip mounting area 14 of the metal substrate 12. The chip stacked structure 20 is formed by stacking, for example, four DRAM (Dynamic Random Access Memory) chips 22 (semiconductor chips) in which a DRAM circuit layer 22*a* is formed, and an IF (interface) chip 24 for controlling the DRAM chips 22. A circuit layer 24*a* having an IF circuit is formed in the IF chip 24. In the DRAM chips 22 and the IF chip 24, a plurality of column shaped bump electrodes 26 and 28 is formed on a main surface side and a rear surface side thereof, respectively. The bump electrode 26 of the main surface side of each semiconductor chip is electrically connected to the bump electrode 28 of the inner surface side through a penetration electrode 30. The DRAM chips 22 and the IF chip 24 are stacked while the circuit layers 22*a* and 24*a* are directed to the metal substrate 12. Further, the bump electrode 26 of each semiconductor chip is electrically connected to the bump electrode 28 of the adjacent semiconductor chip.

The chip stacked structure 20 fixedly adheres to an approximately center location of the metal substrate 12 by means of an insulating adhesive member 32, for example, DAF (Die Attached Film) material in which an adhesive layer is formed on opposite sides of a polyimide base material. The metal substrate 12 and the bump electrode 28 of the DRAM chip 22 adjacent to the metal substrate 12 are insulated by the DAF material 32. Further, material having high thermal conductivity is used as the DAF material. Heat from the chip stacked structure 20 may be effectively transferred to the metal substrate 12. Heat radiation characteristics may be enhanced. Further, the metal substrate 12 may use material of high radiation characteristics such as Cu. The heat radiation characteristics may be further enhanced.

Further, the chip stacked structure sealing member 34 (first sealing member) which covers the chip stacked structure 20 is formed on the metal substrate 12. The chip stacked structure sealing member 34 covers the chip stacked structure 20 while a main surface 24*b* (surface side opposite to a wiring board 38) of the IF chip 24 is exposed. The chip stacked structure sealing member 34 is formed of an underfill material which is made of an insulating material, and is filled between the semiconductor chips 22 and 24 which form the chip stacked structure 20 on the metal substrate 12 and covers side surfaces of the chip stacked structure 20. Further, the chip stacked structure sealing member 34 is locked on the metal substrate 12 by the higher-level portion 18. In addition, a portion of the chip stacked structure sealing member 34, which covers the side surfaces of the chip stacked structure 20, is a fillet portion 34*a*. The fillet portion 34*a* according to this embodiment as the sealing member in a fluid state is blocked by the higher-level portion 18 and then cured to thereby form a constant shape over all side surfaces of the chip stacked structure 20.

Further, a resin sealing member 36 (second sealing member) which is mold-formed to surround the chip stacked structure sealing member 34 is formed on the metal substrate 12. The resin sealing member 36 is formed on the side surfaces of the semiconductor chips 22 and 24 (the side surfaces of the chip stacked structure 20), with material which is different from the chip stacked structure sealing member 34. In addition, an outer circumference of the sealing material overflow stopper is formed to be the same plane surface as the resin sealing member 36.

The wiring board 38 having an approximately rectangular shape and having an area smaller than that of the metal substrate 12 is arranged toward the main surface 24*b* of the IF chip 24. The wiring board 38 is arranged on a surface of the chip stacked structure 20 which is opposite to the chip mounting area 14 and is also electrically connected to the chip stacked structure 20. The wiring board 38 is, for example, a flexible substrate which is made of polyimide base material having a thickness of 100 μm, and predetermined wirings 45 are formed on opposite sides of the wiring board 38. The wirings 45 of the main surface 38*a* of the wiring board 38 are covered with an insulating film, for example, a solder resist 40. A plurality of connection pads 41 is formed on a surface of the wiring board 38 which is opposite to the main surface 38*a*. Further, a plurality of land sections 42 is formed on the main surface 38*a* of the wiring board 38. The connection pads 41 and the land sections 42 are electrically connected to each other by the wirings 45, respectively. The plurality of land sections 42 is arranged in a lattice pattern with a predetermined interval, for example, 0.8 mm on the wiring board 38. The chip stacked structure 20 and the flexible wiring board 38 are connected to each other by a flip chip junction.

Wire bumps or solder bumps 44 which are made of gold or the like are formed on main surface bump electrodes 26*a* which are installed on the main surface 24*b* of the IF chip 24. The main surface bump electrodes 26*a* are electrically connected to the connection pads 41 of the wiring board 38 through the solder bumps 44. Further, a wiring board sealing member 46 which is made of underfill material is filled between the inner surface side of the wiring board 38 and the main surface side of the IF chip, to thereby protect the solder bumps 44 by the wiring board sealing member 46 and adhesively fix the wiring board 38. Further, solder balls 48 which are external terminals of the semiconductor device are mounted on the plurality of land sections 42 of the main surface 38*a* of the wiring board 38, respectively.

As described above, since the semiconductor device 10 is configured to include the chip stacked structure 20 which is formed of the plurality of DRAM chips 22 (semiconductor chips) and the IF chip 24 (semiconductor chip), which are electrically connected to each other through the penetration electrodes 30, the metal substrate 12 on which the chip stacked structure 20 is mounted, and the wiring board 38 which is electrically connected to the IF chip 24 of the chip stacked structure 20, the small semiconductor device 10 having high electric characteristics may be obtained with large capacity. Further, since the metal substrate 12 on which the chip stacked structure 20 is mounted is provided, high heat radiation may be achieved and mechanical strength may be enhanced.

Further, since the chip mounting area 14 of the main surface 12*a* of the metal substrate 12 is thinner than the other sections of the metal substrate 12, and the peripheral section of the chip mounting area 14 is made thick, the semiconductor device 10 may be thin and the strength of the metal substrate 12 may be secured.

In addition, since the chip mounting area 14 of the metal substrate 12 is thinner than the other sections thereof, adhesion area between the metal substrate 12 and the chip stacked structure sealing member 34 may become large, to thereby enhance the adhesion strength between the metal substrate 12 and the chip stacked structure sealing member 34, and improve the mechanical strength of the semiconductor device 10.

Further, the higher-level portion 18 (sealing material overflow stopper) is formed in the lower-level portion 16 which forms the chip mounting area 14 of the metal substrate 12. That is, the chip stacked structure sealing member 34 may be prevented from being flowed over the main surface of the metal substrate 12 from the chip mounting area 14. Spreading of the chip stacked structure sealing member 34 over the metal substrate 12 may be prevented. Accordingly, the chip stacked structure sealing member 34 may form the desired fillet portion 34*a* around the chip stacked structure 20. Voids between the semiconductor chips may be reduced. Reliability of the semiconductor device 10 may be enhanced.

The chip stacked structure 20 and the flexible wiring board 38 having small area than that of the metal substrate 12 are connected by the flip chip junction. Stress applied from the outside terminals may be lessened. Reliability for secondary mounting of the semiconductor device 10 may be enhanced. Furthermore, by changing the design of the wiring board 38, arrangement of the solder balls 48 (external terminals) of the semiconductor device 10 may be easily changed.

Figure 3A:
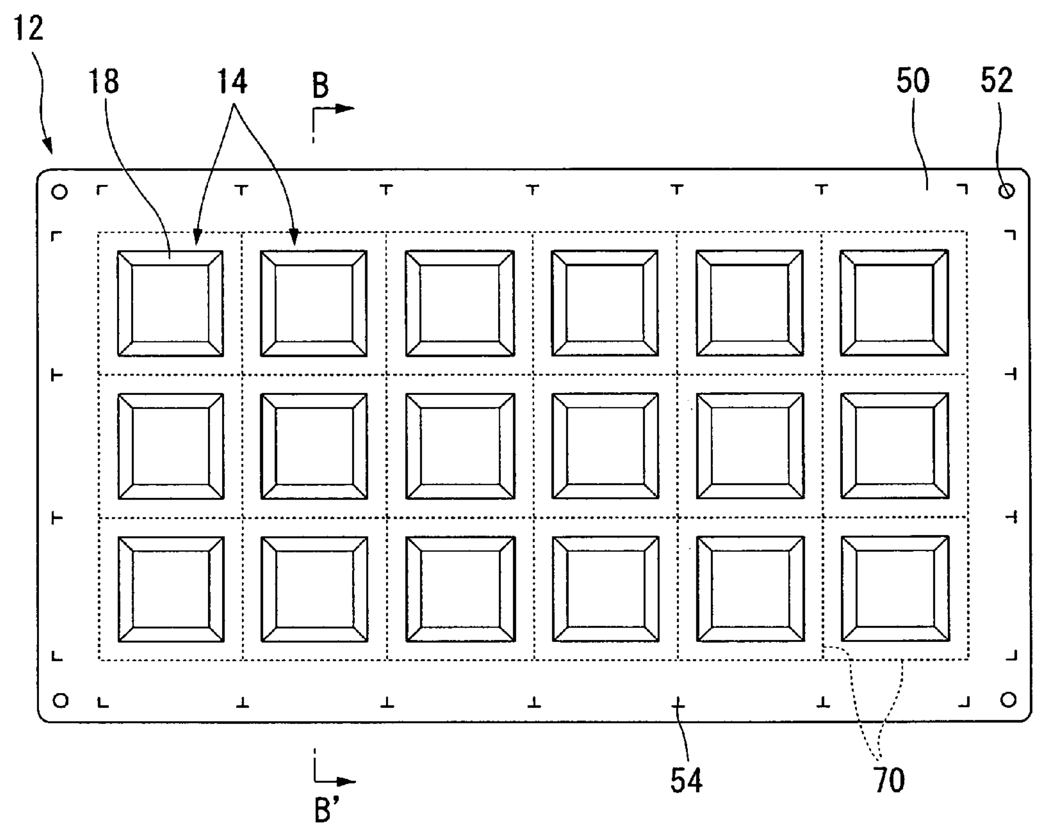
FIG. 3A is a plan view illustrating a metal substrate which is used for manufacturing the semiconductor device of FIGS. 1 and 2.
Figure 3B:
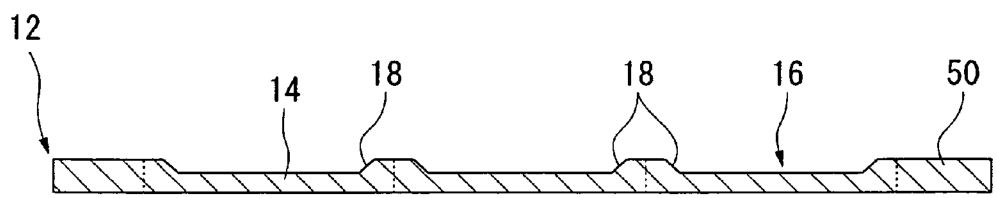
FIG. 3B is a sectional view illustrating the metal substrate, taken along a B-B' line in FIG. 3A.

A manufacturing method of the semiconductor device according to the invention will be described with reference to the accompanying drawings. FIG. 3A is a plan view illustrating a metal substrate which is used for manufacturing the semiconductor device. FIG. 3B is a sectional view taken along line B-B' in FIG. 3A.

A metal substrate 12 is prepared as a plate shape which is formed of alloy 42 which is an iron nickel alloy having a thickness of, for example, 0.2 mm. The metal substrate 12 is processed by a MAP (mold alloy process) method, and the plurality of chip mounting sections 14 is arranged in a center region thereof in a matrix formation. A substrate frame section 50 is arranged in an outer region which surrounds the center region of the metal substrate 12, and a plurality of positioning holes 52 is formed at a predetermined interval and is used to transport and position the metal substrate 12 in the substrate frame section 50. Dicing marks 54 indicating positions of dicing lines 70 are formed in the substrate frame section 50 of the main surface of the metal substrate 12, and the dicing lines can be recognized after sealing the center region.

The chip mounting sections 14 of the metal substrate 12 are partitioned by forming the lower-level portions 16 in the metal substrate 12, which is thinner than the other sections of a thickness of, for example, about 0.1 mm. The higher-level portion 18 (overflow stopper) having a sloped surface is formed in an outer edge section of each lower-level portion 16 which forms the chip mounting area 14 of the metal substrate 12. The substrate thickness of the chip mounting sections 14 of the metal substrate 12 is made thin, but the metal substrate 12 is formed with a thick section in a lattice pattern in longitudinal and transverse directions. The strength of the metal substrate can be secured.

FIGS. 4 to 7 illustrate a stacking process of the semiconductor chips.

In the stacking process of the semiconductor chips, the plurality of DRAM chips 22 and the IF chip 24 are stacked, and the chips 22 and 24 are electrically connected to each other through the penetration electrodes 30. The chip stacked structures 20 are formed on the chip mounting sections 14.

Figure 4:
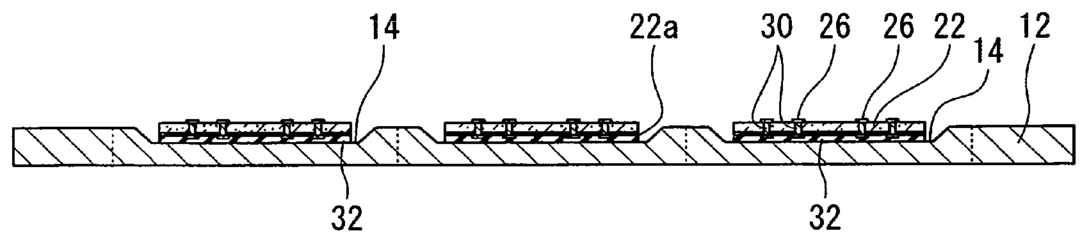
FIG. 4 is a cross sectional view illustrating a semiconductor device in a step involved in a method of forming the semiconductor device of FIGS. 1 and 2 using the metal substrate of FIGS. 3A and 3B.
Figure 5:
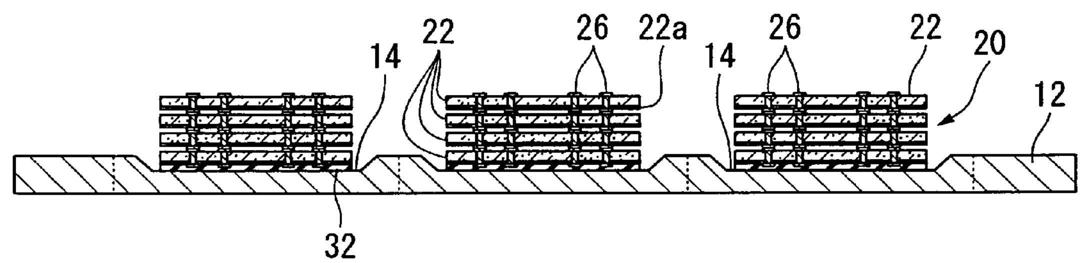
FIG. 5 is a cross sectional view illustrating a semiconductor device in a step, subsequent to the step of FIG. 4, involved in the method of forming the semiconductor device of FIGS. 1 and 2 using the metal substrate of FIGS. 3A and 3B.

As shown in FIG. 4, the DAF material 32 which is an adhesive member fixedly adheres to each of the chip mounting sections 14 of the metal substrate 12. Then, the DRAM chips 22 in which the plurality of penetration electrodes 30 are formed are temporarily fixed to the DAF material 32 which is formed in the metal substrate 12 at a low temperature, for example, 150° C. The bump electrodes 28 of the second DRAM chip 22 are temporarily fixed to the bump electrodes 26 of the first DRAM chip 22 which is temporarily fixed to the metal substrate 12 at a temperature of, for example, 150° C. The DRAM chips 22 are stacked. As shown in FIG. 5, similar to the second DRAM chip 22, the third DRAM chip 22 and the fourth DRAM chip 22 are sequentially temporarily fixed. Similar to the first DRAM chip 22, the second to fourth DRAM chips 22 are stacked while the circuit layer 22*a* thereof is directed to the metal substrate 12.

Figure 6:
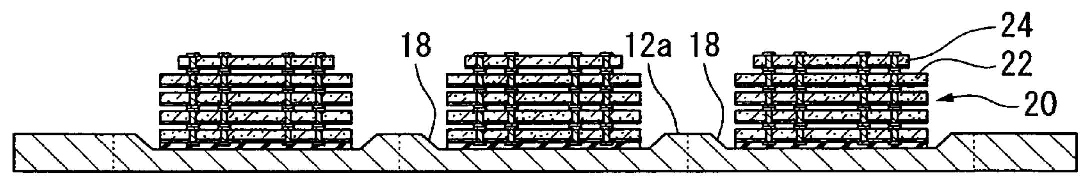
FIG. 6 is a cross sectional view illustrating a semiconductor device in a step, subsequent to the step of FIG. 5, involved in the method of forming the semiconductor device of FIGS. 1 and 2 using the metal substrate of FIGS. 3A and 3B.

The IF chip 24 is stacked on the stacked DRAM chips 22. The IF chip 24 is stacked by temporarily fixing the bump electrodes 28 of the IF chip 24 as shown in FIG. 6 to the opposing bump electrodes 26 of the fourth DRAM chips 22 at a temperature of, for example, 150° C. The chip stacked structures 20 are formed. Then, load is applied to the chip stacked structures 20 at a high temperature, for example, 300° C. Actual pressure bonding is performed between the bump electrodes 26 and 28 of the respective semiconductor chips 22 and 24 of the chip stacked structures 20. Accordingly, electric connection is achieved between the semiconductor chips 22 and 24 of the chip stacked structures 20 through the penetration electrodes. The chip stacked structures 20 are mounted on all the chip mounting sections 14 of the metal substrate 12. Further, junction between the semiconductor chips 22 and 24 may be achieved not only by load but also by application of ultrasonic waves.

The side surface of each chip stacked structure 20 is covered by the stacked structure sealing member 34 in a non-cured state, and the non-cured stacked structure sealing member 34 is filled between the DRAM chips 22 and between the DRAM chips 22 and the IF chip 24. The non-cured stacked structure sealing member 34 is blocked by the higher-level portion 18, and then, the stacked structure sealing member 34 is cured.

Figure 7:
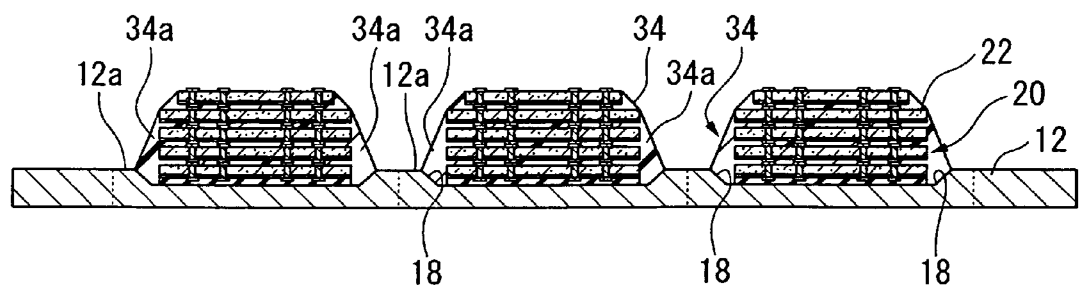
FIG. 7 is a cross sectional view illustrating a semiconductor device in a step, subsequent to the step of FIG. 6, involved in the method of forming the semiconductor device of FIGS. 1 and 2 using the metal substrate of FIGS. 3A and 3B.

As shown in FIG. 7, the non-cured stacked structure sealing member 34 is supplied to an outer circumference section of each chip stacked structure 20 on the metal substrate 12. The supplied non-cured stacked structure sealing member 34 fills gaps between the DRAM chips 22, and a gap between the DRAM chips 22 and the IF chip 24 according to a capillary tube phenomenon. Here, the higher-level portion 18 having a sloped surface is formed around each chip mounting area 14 of the metal substrate 12. Thus, the non-cured stacked structure sealing member 34 is blocked by the higher-level portion 18, and flowing thereof over the main surface 12*a* of the metal substrate 12 is prevented. Thereafter, the metal substrate 12 is cured at a temperature of, for example, about 180° C. The non-cured stacked structure sealing member 34 is cured. Accordingly, the chip stacked structure sealing member 34 having a desired fillet portion 34*a* can be formed around the chip stacked structure 20.

Figure 8:
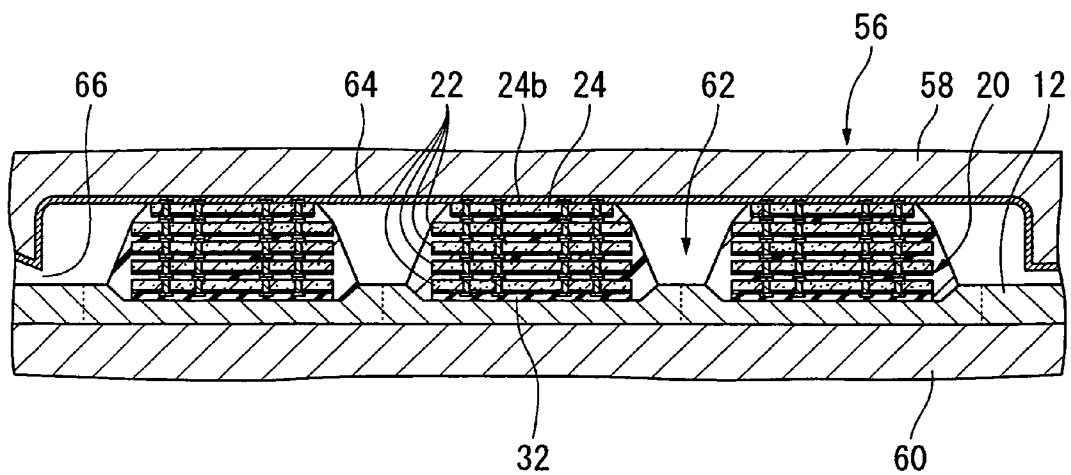
FIG. 8 is a cross sectional view illustrating a semiconductor device in a step, subsequent to the step of FIG. 7, involved in the method of forming the semiconductor device of FIGS. 1 and 2 using the metal substrate of FIGS. 3A and 3B.
Figure 9:
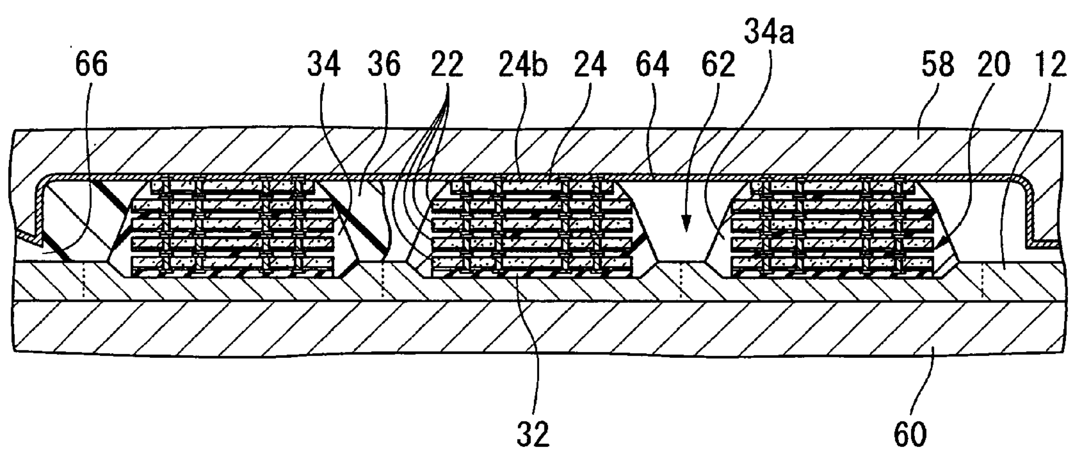
FIG. 9 is a cross sectional view illustrating a semiconductor device in a step, subsequent to the step of FIG. 8, involved in the method of forming the semiconductor device of FIGS. 1 and 2 using the metal substrate of FIGS. 3A and 3B.
Figure 10:
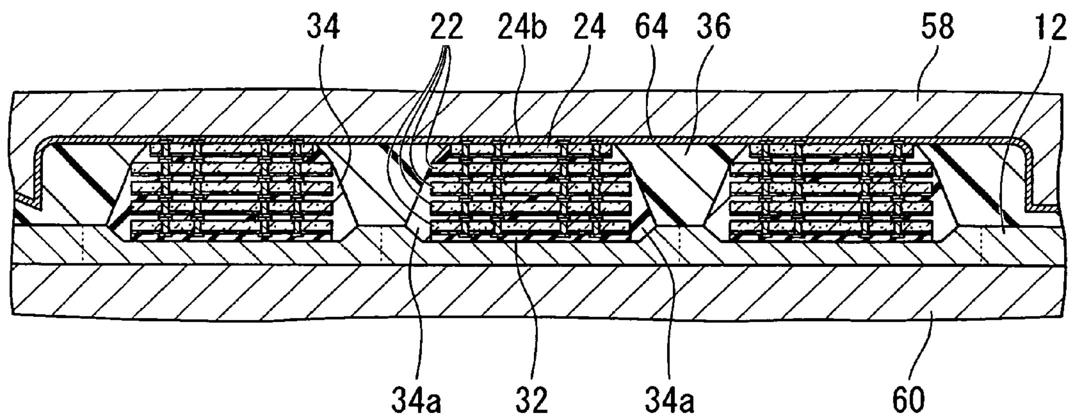
FIG. 10 is a cross sectional view illustrating a semiconductor device in a step, subsequent to the step of FIG. 9, involved in the method of forming the semiconductor device of FIGS. 1 and 2 using the metal substrate of FIGS. 3A and 3B.
Figure 11A:
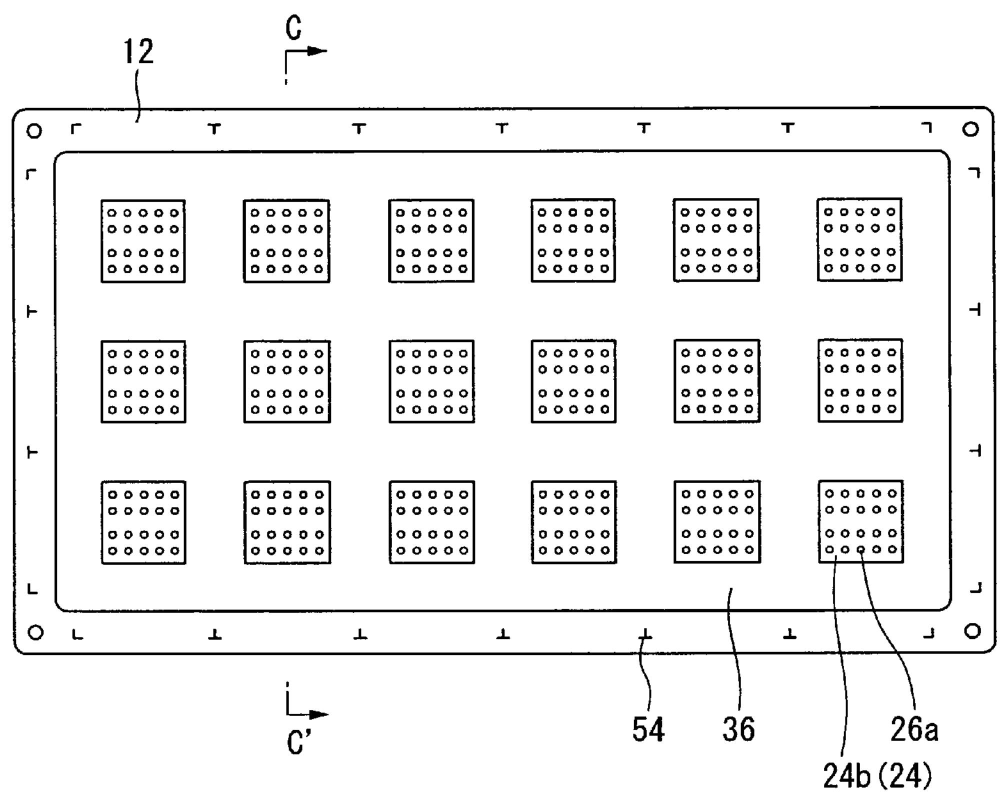
FIG. 11A is a plan view illustrating a semiconductor device in a step, subsequent to the step of FIG. 10, involved in the method of forming the semiconductor device of FIGS. 1 and 2 using the metal substrate of FIGS. 3A and 3B.
Figure 11B:
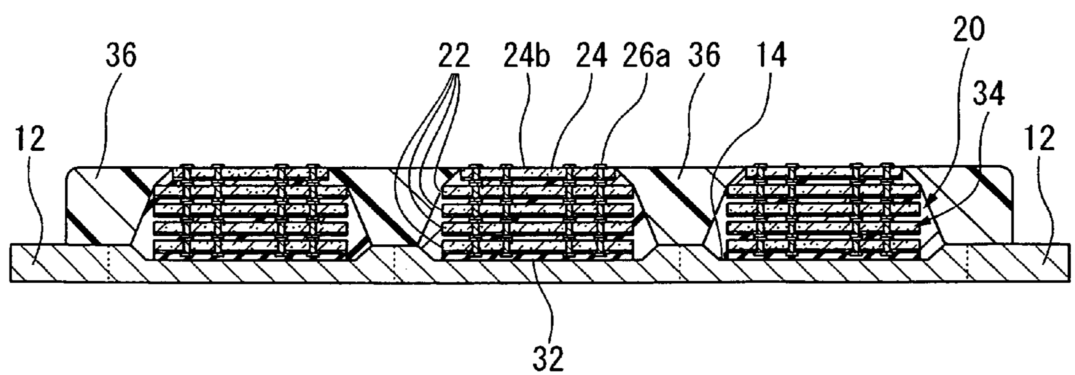
FIG. 11B is a cross sectional view illustrating the semiconductor device, taken along a C-C' line of FIG. 11A.

FIGS. 8 to 10 illustrate a mold process of the semiconductor device. FIG. 11A is a plan view illustrating the metal substrate after completion of molding. FIG. 11B is a sectional view taken along line C-C' in FIG. 11A.

In the mold process, as shown in FIG. 8, the metal substrate 12 on which the chip stacked structures 20 are mounted is set in a shaping mold having an upper mold 58 and a lower mold 60 of a transfer mold apparatus 56. A cavity 62 is formed in the shaping mold, and the chip stacked structures 20 on the metal substrate 12 are arranged in the cavity 62. Further, a sheet 64 having an elastic force is arranged in the upper mold 58. The upper mold 58 and the lower mold 60 are moldclamped through the sheet 64. Sealing resin does not flow onto the main surface 24*b* of the IF chip 24 of each chip stacked structure 20. Further, a gate section 66 is formed in the shaping mold.

Subsequently, as shown in FIG. 9, sealing resin which is heated and molten is injected in the cavity 62 through the gate section 66. As the sealing resin, for example, heat curable resin such as epoxy resin is used. As shown in FIG. 10, while the cavity 62 on one surface side of the metal substrate 12 is filled with the sealing resin, the sealing resin is thermally cured at a predetermined temperature, for example, about 180° C. As shown in FIGS. 11A and 11B, the resin sealing member 36 which covers in a batch the plurality of chip mounting sections 14 of the metal substrate 12 is formed. Then, the metal substrate 12 on which the resin sealing member 36 is formed is reflowed at a predetermined temperature, for example, about 240° C., to thereby obtain the cured resin sealing member 36. Since the main surface 24*b* of each IF chip 24 has been arranged in contact with the upper mold 58 through the sheet 64, the main surface 24*b* of the IF chip 24 from the chip stacked structure sealing member 34 is exposed, and at the same time, the main surface pad electrode 26*a* is exposed. Further, the chip stacked structure sealing member 34 is filled between the semiconductor chips 22 and 24 of the chip stacked structure 20, and then the resin sealing member 36 which covers the metal substrate 12 in a batch is formed to thereby restrict voids from being generated between the chips when molding.

Figure 12:
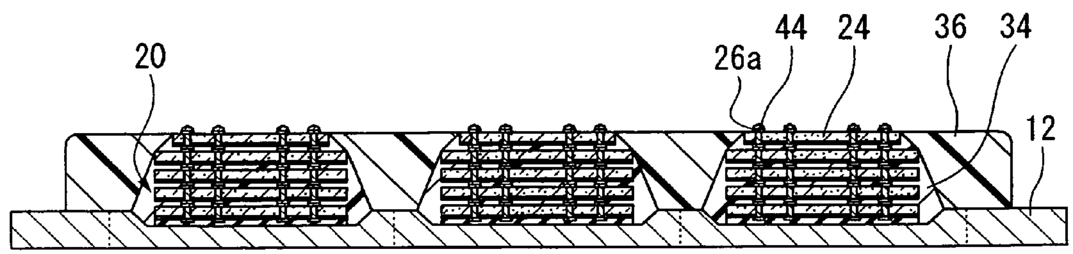
FIG. 12 is a cross sectional view illustrating a semiconductor device in a step, subsequent to the step of FIGS. 11A and 11B, involved in the method of forming the semiconductor device of FIGS. 1 and 2 using the metal substrate of FIGS. 3A and 3B.
Figure 13:
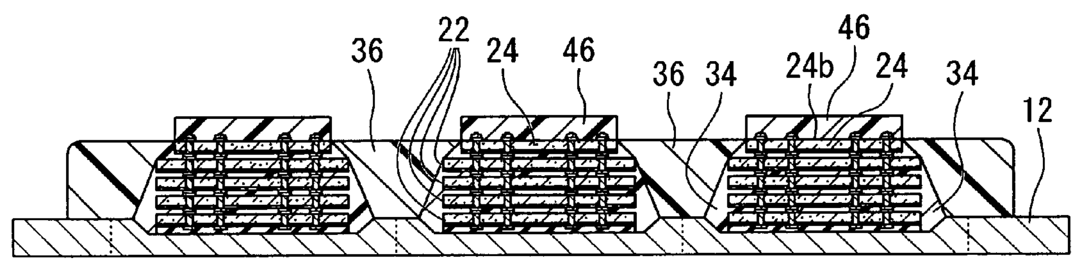
FIG. 13 is a cross sectional view illustrating a semiconductor device in a step, subsequent to the step of FIG. 12, involved in the method of forming the semiconductor device of FIGS. 1 and 2 using the metal substrate of FIGS. 3A and 3B.
Figure 14:
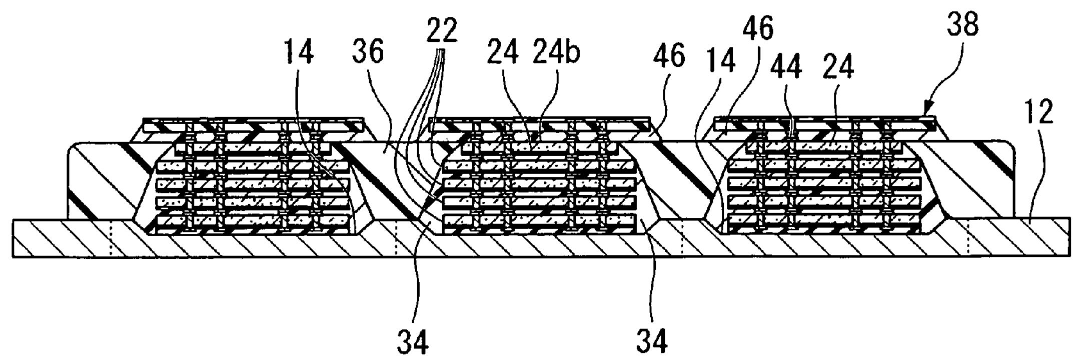
FIG. 14 is a cross sectional view illustrating a semiconductor device in a step, subsequent to the step of FIG. 13, involved in the method of forming the semiconductor device of FIGS. 1 and 2 using the metal substrate of FIGS. 3A and 3B.

FIGS. 12 to 14 are sectional views illustrating a mounting process of the wiring board of the semiconductor device.

In the metal substrate 12 in which the chip stacked structure sealing member 34 is formed, as shown in FIG. 11, the main surface 24*b* of each IF chip 24 is exposed from the chip stacked structure sealing member 34. As shown in FIG. 12, the wire bumps 44 are respectively formed on the plurality of bump electrodes 26*a* which is arranged on the main surface 24*b* of the IF chip 24. The wire bumps 44 are made, for example, of gold, and are formed by connecting wires which are melted by a bonding apparatus (not shown) and on which balls are formed in a front end part thereof onto the bump electrodes 26*a* of the IF chip 24 by thermal pressure bonding with ultrasonic waves, and then by drawing and cutting out a rear end part thereof. The wire bumps 44 are formed on all the bump electrodes 26*a* of the IF chip 24.

A printing mask (not shown) is mounted on a section other than the main surface 24*b* of the IF chip 24, and underfill material is supplied using a squeegee (not shown). Thus, as shown in FIG. 13, the underfill material is selectively supplied on the main surface 24*b* of the IF chip 24 to form the wiring board sealing member 46. After the wiring board is mounted, the underfill material may be injected into gaps between the IF chip 24 and the wiring board 38 to form the wiring board sealing member 46.

Subsequently, as shown in FIG. 14, the wiring board 38 is mounted on each IF chip 24. The wiring board 38 is a flexible wiring board in which wirings are formed on opposite sides of a polyimide base material in an approximately rectangular shape, and has the area which is smaller than that of the chip mounting area 14 of the metal substrate 12. As the wire bumps 44 of the IF chip 24 and the plurality of connection pads 41 which is formed on a rear surface of the wiring board 38 are thermally pressure-bonded, the chip stacked structure 20 and the wiring board 38 are electrically connected to each other. Accordingly, the wiring board sealing member 46 which is formed on the IF chip 24 is spread to an end part of the wiring board 38, and the wiring board 38 is adhesively fixed to the chip mounting sections 14 of the metal substrate 12. Since the wiring board 38 having the area smaller than that of the chip mounting area 14 is mounted, when the wiring board 38 is mounted, the risk that the adjacent wiring boards 38 come in contact with each other or the wiring board sealing member 46 flows toward the adjacent wiring board 38 can be reduced, and the wiring board 38 can be effectively mounted. Further, the wire bumps 44 are formed to make an easy connection between the IF chip 24 on which the wiring board sealing member 46 is applied and the wiring board 38, but the bump electrodes 26*a* of the IF chip 24 and the connection pads 41 of the wiring board 38 may be directly connected to each other.

Figure 15A:
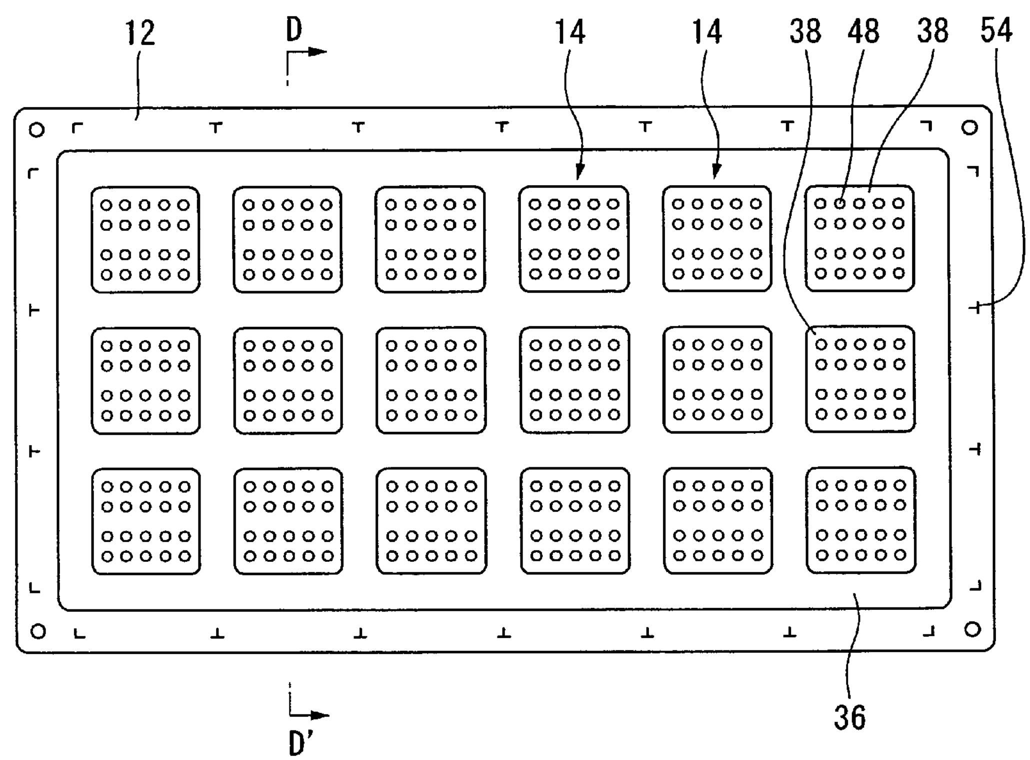
FIG. 15A is a plan view illustrating a semiconductor device in a step, subsequent to the step of FIG. 14, involved in the method of forming the semiconductor device of FIGS. 1 and 2 using the metal substrate of FIGS. 3A and 3B.
Figure 15B:
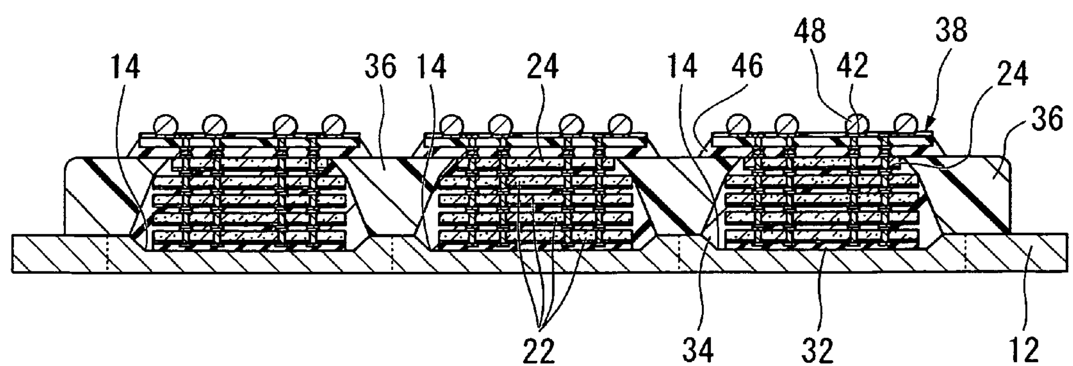
FIG. 15B is a cross sectional view illustrating the semiconductor device, taken along a D-D' line of FIG. 15A.

FIG. 15A is a plan view illustrating the metal substrate after the solder balls are mounted. FIG. 15B is a sectional view taken along line D-D' in FIG. 15A.

The metal substrate 12 in which the wiring board 38 is mounted on the IF chip 24 goes to a ball mounting process, and the conductive metal balls, for example, the solder balls 48 are mounted on the land sections 42 which are formed on the main surface of the wiring board 38 as shown in FIGS. 15A and 15B. The bump electrodes which become the external terminals are formed.

In the ball mounting process, a plurality of adsorption holes is formed to correspond to the plurality of land sections 42 which is arranged on the wiring board 38, and the solder balls 48 made by soldering or the like are adsorbed and held in a mounting tool of a ball mounter (not shown), flux is transferred to the solder balls 48 which are adsorbed and held, and then the solder balls 48 are mounted in a batch on the plurality of land sections on the wiring board 38. Further, after the solder balls 48 are mounted on all the wiring boards 38, the metal substrate 12 is reflowed to obtain the bump electrodes 48.

Figure 16A:
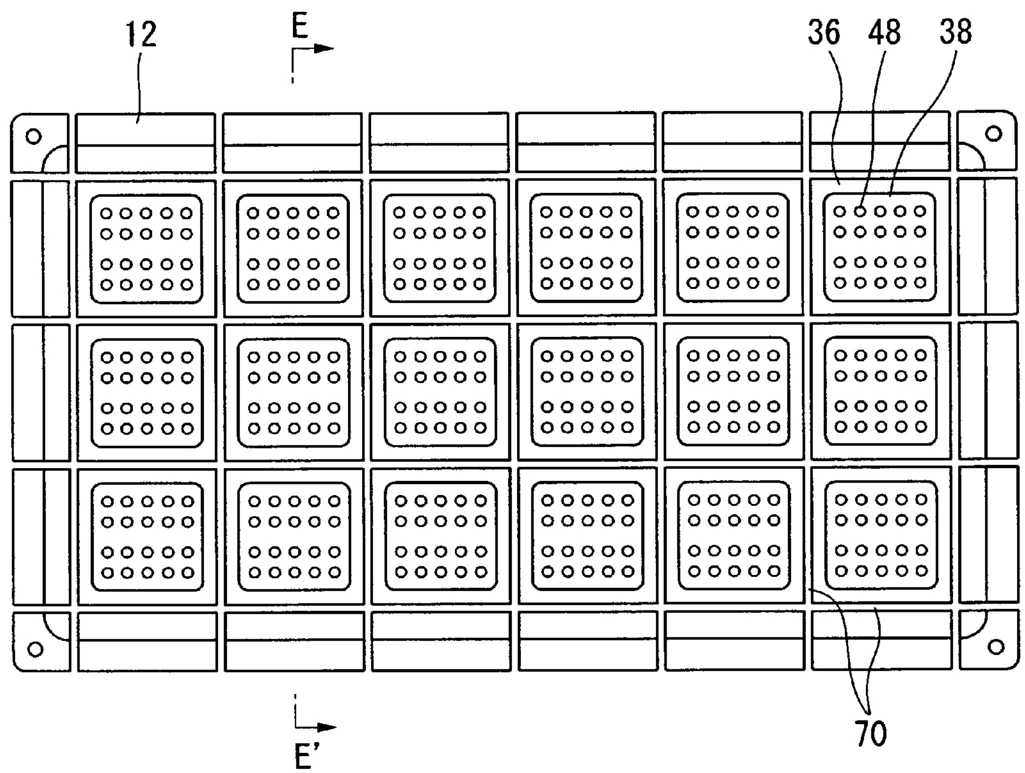
FIG. 16A is a plan view illustrating a semiconductor device in a step, subsequent to the step of FIGS. 15A and 15B, involved in the method of forming the semiconductor device of FIGS. 1 and 2 using the metal substrate of FIGS. 3A and 3B.
Figure 16B:
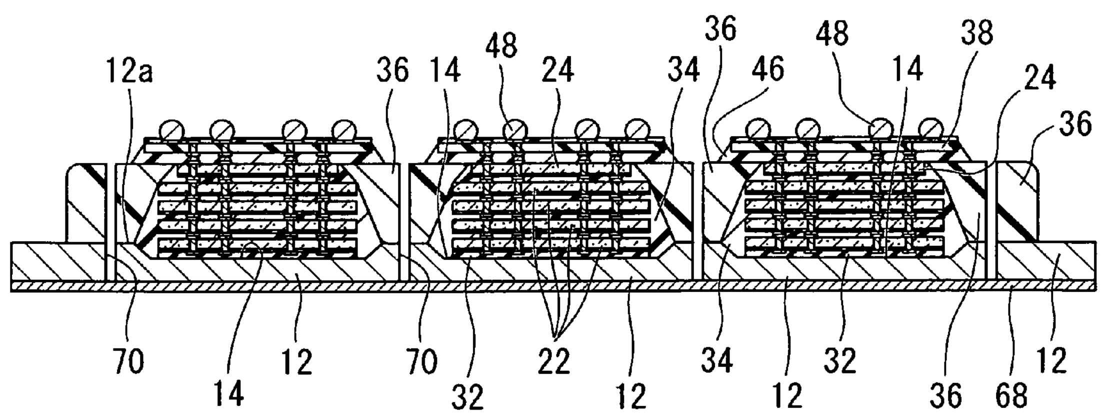
FIG. 16B is a cross sectional view illustrating the semiconductor device, taken along an E-E' line of FIG. 16A.

FIG. 16A is a plan view illustrating the metal substrate after dicing the substrate. FIG. 16B is a sectional view taken along line E-E' in FIG. 16A.

The metal substrate 12 on which the solder balls are mounted goes to a substrate dicing process, and the metal substrate 12 is cut as shown in FIGS. 16A and 16B, to thereby be separated corresponding to every chip mounting area 14.

In the substrate dicing process, a surface of the metal substrate 12 which is opposite to the main surface 12*a* is attached to a dicing tape 68. The metal substrate 12 is supported by the dicing tape 68. Thereafter, the dicing line 70 is cut in longitudinal and transverse directions by a dicing blade of a dicing apparatus (not shown). Cutting and separation is performed for every chip mounting area 14. The sealing resin member 36 which integrally covers the chip mounting sections 14 is formed on the metal substrate 12. Dicing marks are formed in the frame section. Recognition of cutting locations and cutting and separation for every chip mounting area 14 can be performed. In this embodiment, the wiring board 38 having the size smaller than that of the chip mounting area 14 is mounted. The metal substrate 12 can be cut while the dicing blade is not in contact with the wiring board 38. After the cutting and separation of the metal substrate 12, the semiconductor device 10 is obtained as shown in FIGS. 1 and 2 by being picked up from the dicing tape 68.

In this embodiment, the chip stacked structures 20 are mounted on the metal substrate 12. The chip stacked structures 20 on the metal substrate 12 are sealed to expose the main surface 24*b* of the IF chip 24 of the chip stacked structure 20 which is distant from the metal substrate 12. The wiring board 38 is mounted on the main surface 24*b* of the exposed IF chip 24. A small semiconductor device having high electric characteristics with large capacity can be obtained due to the penetration electrodes.

The chip stacked structures 20 are supported by the metal substrate 12. Bend of the semiconductor device in the manufacturing process can be reduced, and at the same time, multiple connections can become easy and quantity production efficiency can be improved. In addition, an existing Ball Grid Array (BGA) assembly apparatus may be used.

The higher-level portion 18 (sealing material overflow stopper) is formed in the lower-level portion 16 which forms the chip mounting area 14 of the metal substrate 12. The chip stacked structure sealing member 34 can be prevented from flowing over the main surface 12*a* of the metal substrate 12 from the chip mounting area 14. Spreading of the chip stacked structure sealing member 34 onto the metal substrate 12 can be prevented. Accordingly, the chip stacked structure sealing member 34 can form the desired fillet portion 34*a* around the chip stacked structure 20, and generation of voids between the chips can be avoided. The reliability of the semiconductor device 10 can be enhanced.

Second Embodiment

A semiconductor device according to a second embodiment of the invention will be described with reference to the accompanying drawings.

Figure 17:
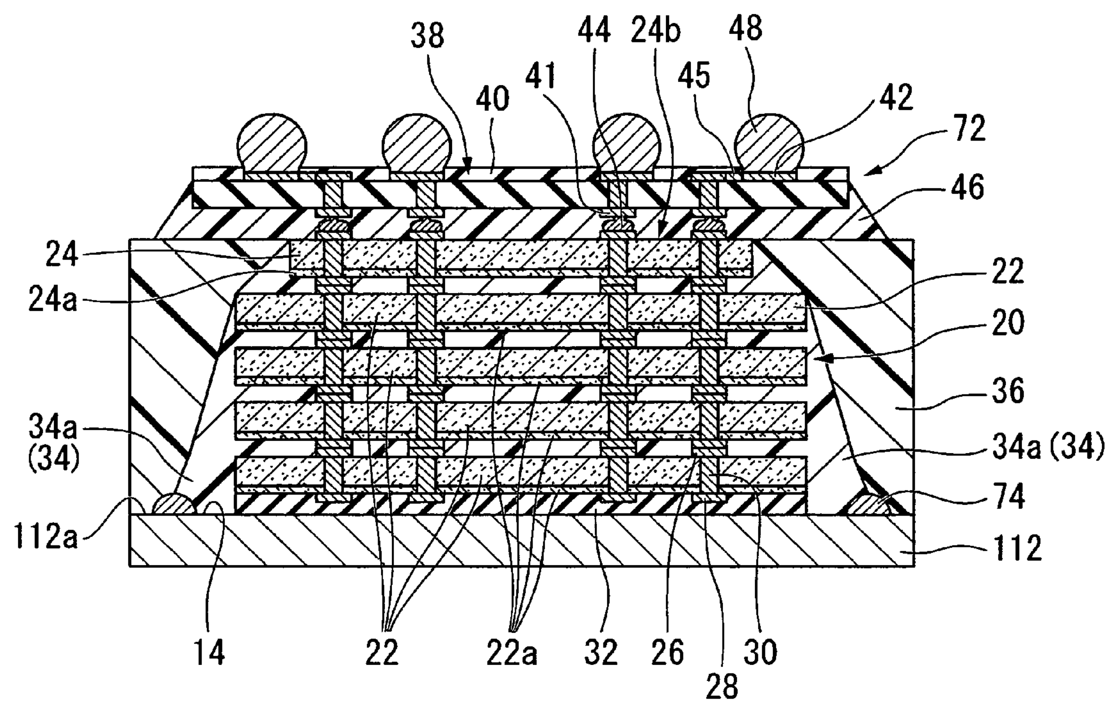
FIG. 17 is a cross sectional elevation view illustrating a COC-type semiconductor device according to a second embodiment of the invention.

FIG. 17 is a sectional view illustrating the semiconductor device according to the second embodiment.

The semiconductor device 72 shown in FIG. 17 includes a metal substrate 112 of an approximately rectangular shape. The metal substrate 112 is formed of alloy 42 which is an iron nickel alloy having a thickness of, for example, 0.2 mm. The metal substrate 112 has the same configuration as in the metal substrate 12 in the first embodiment, except for the following. A higher-level portion 74 is provided on the substrate 112. The higher-level portion 74 may typically be realized by a projecting member 74. The higher-level portion 74 performs as a sealing material overflow stopper. The projecting member 74 projects from the main surface of the metal substrate 112. The top of the projecting member 74 is higher in level than the main surface of the metal substrate 112. The projecting member 74 surrounds the chip mounting area 14 of the main surface 112*a* of the metal substrate 112. The projecting member 74 performs as a sealing material overflow stopper that stops overflow of the sealing material to outside the chip mounting area 14. The projecting member 74 may typically be provided instead of the higher-level portion 18. The chip mounting area 14 of the main surface 112*a* is surrounded by the projecting member 74.

In the metal substrate 112, the projecting member 74 (sealing material overflow stopper) which protrudes from the main surface of the metal substrate 112 is formed in the outer circumference section of the chip mounting area 14. The sealing material overflow stopper is formed of material which is different from the substrate 12. Further, the outer circumference of the sealing material overflow stopper is formed to be the same plane surface as the resin sealing member 36. The projecting member 74 can prevent the chip stacked structure sealing member 34 from flowing onto the main surface 112*a* of the metal substrate 112 over the projecting member 74. The projecting member 74 can also prevent spreading of the chip stacked structure sealing member 34 on the metal substrate 112. The desired fillet portion 34*a* of the chip stacked structure sealing member 34 can be formed around the chip stacked structure 20. Accordingly, generation of voids between the semiconductor chips 22 and 24 can be avoided. The reliability of the semiconductor device 72 can be enhanced. The projecting member 74 may be formed of resin, metal, or the like.

A manufacturing method of the semiconductor device according to the second embodiment will be described.

Figure 18A:
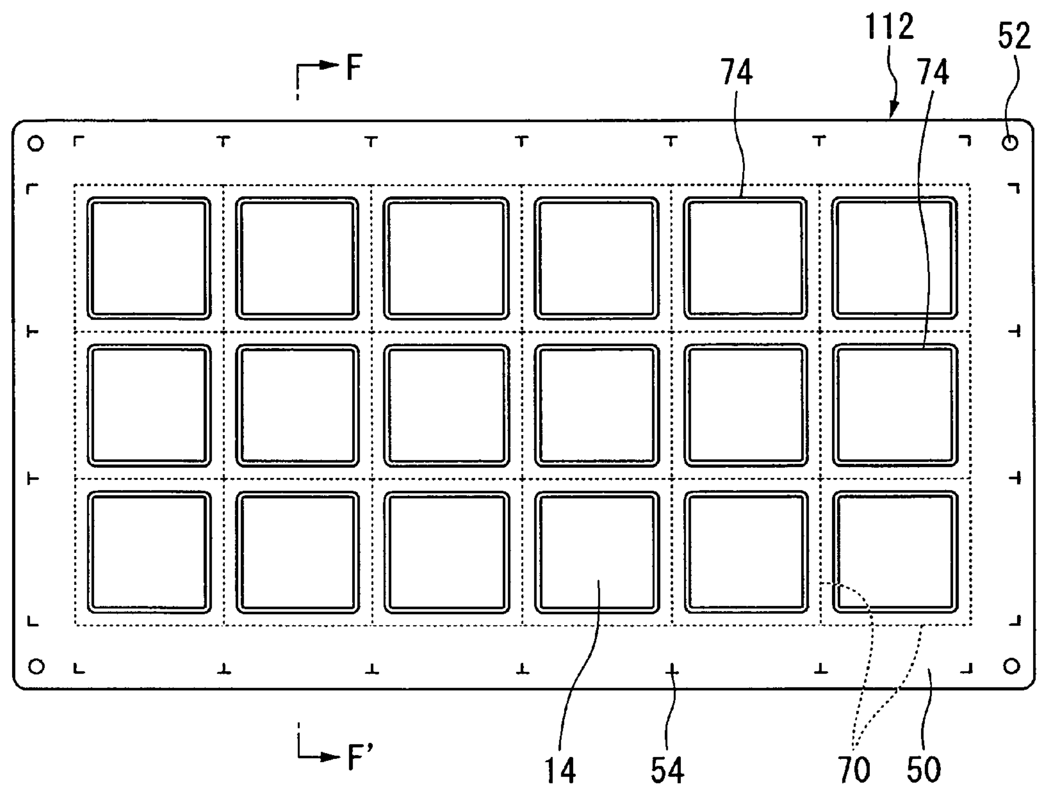
FIG. 18A is a plan view illustrating a metal substrate which is used for manufacturing the semiconductor device of FIG. 17.
Figure 18B:
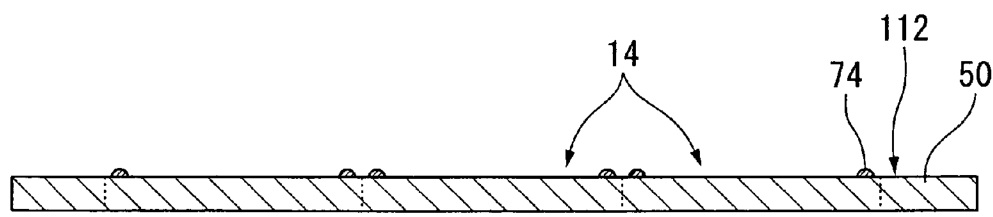
FIG. 18B is a sectional view illustrating the metal substrate, taken along a line F-F' in FIG. 18A.
Figure 19:
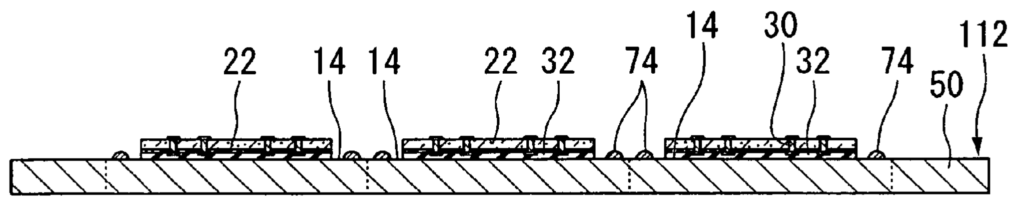
FIG. 19 is a cross sectional view illustrating a semiconductor device in a step involved in a method of forming the semiconductor device of FIG. 17 using the metal substrate of FIGS. 18A and 18B.
Figure 20:
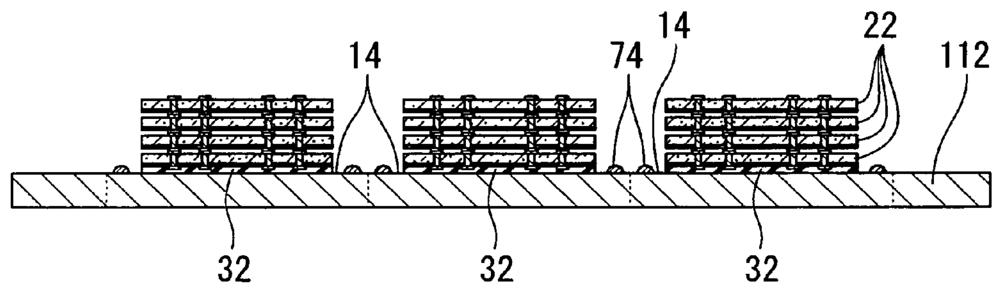
FIG. 20 is a cross sectional view illustrating a semiconductor device in a step subsequent to the step of FIG. 19, involved in the method of forming the semiconductor device of FIG. 17 using the metal substrate of FIGS. 18A and 18B.
Figure 21:
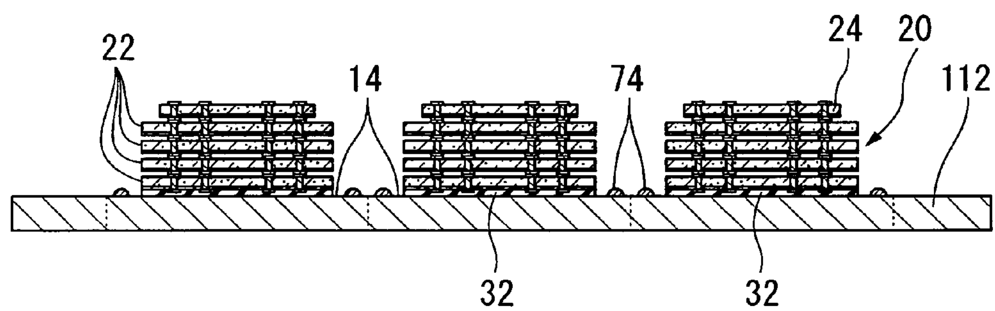
FIG. 21 is a cross sectional view illustrating a semiconductor device in a step subsequent to the step of FIG. 20, involved in the method of forming the semiconductor device of FIG. 17 using the metal substrate of FIGS. 18A and 18B.
Figure 22:
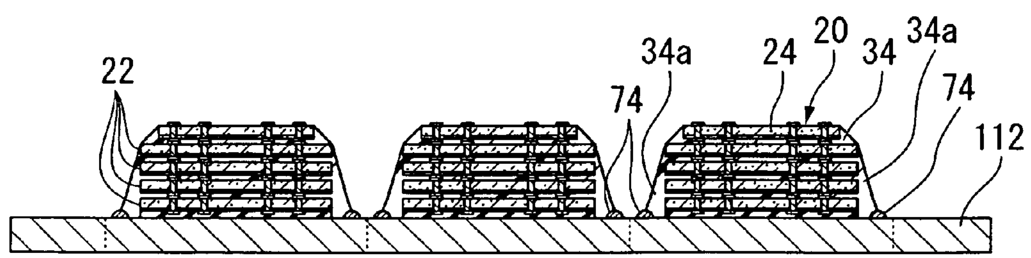
FIG. 22 is a cross sectional view illustrating a semiconductor device in a step subsequent to the step of FIG. 21, involved in the method of forming the semiconductor device of FIG. 17 using the metal substrate of FIGS. 18A and 18B.

FIG. 18A is a plan view illustrating a metal substrate which is used for the manufacturing method of the semiconductor device according to the second embodiment. FIG. 18B is a sectional view taken along line F-F' in FIG. 18A.

The metal substrate 112 is a plate shape which is formed of alloy 42 which is an iron nickel alloy having a thickness of, for example, 0.2 mm. The metal substrate 112 is configured to be processed by a MAP method, and the plurality of chip mounting sections 14 is arranged in a center region thereof in a matrix formation. A substrate frame section 50 is arranged in an outer side of the center region, and a plurality of positioning holes 52 is formed at a predetermined interval in the substrate frame section 50 and is used to transport and position the metal substrate 112. Dicing marks 54 indicating positions of dicing lines 70 are formed in the substrate frame section 50 of the main surface 112*a* of the metal substrate 112, and the dicing lines 70 can be recognized after sealing the center region. Thus, the metal substrate 112 is prepared as shown in FIGS. 18A and 18B.

FIGS. 19 to 22 are sectional views illustrating a stacking process of the semiconductor chips.

The stacking process of the semiconductor chip is performed as shown in FIGS. 19 to 22. The processes in FIGS. 19 to 22 are the same as in the first embodiment shown in FIGS. 4 to 7. Detailed but duplicate descriptions thereof will be omitted.

The protrusion shape fence section 74 which protrudes from the main surface 112*a* of the metal substrate 112 is formed in an outer circumference section of the chip mounting area 14 of the metal substrate 112. The projecting member 74 is formed to surround the chip mounting area 14 in a circular shape. The projecting member 74 may have such a predetermined height that the chip stacked structure sealing member 34 may not flow over the projecting member 74 onto the metal substrate 112, and the sectional shape of the projecting member 74 is not limited thereto. Since the projecting member 74 is formed around the chip mounting area 14, the chip stacked structure sealing member 34 is blocked by the projecting member 74. The chip stacked structure sealing member 34 can be prevented from flowing over the projecting member 74 onto the main surface 112*a* of the substrate 112. Thus, since the spreading of the chip stacked structure sealing member 34 can be prevented, the fillet portion 34*a* of the chip stacked structure sealing member 34 can be stably formed around the chip stacked structure 20.

Through the same processes of the first embodiment as shown in FIGS. 8 to 16, the metal substrate 112 which is cut and separated is picked up from the dicing tape 68, to thereby obtain the semiconductor device 72 as shown in FIG. 17.

In this embodiment, the chip stacked structure 20 is mounted on the metal substrate 112, the chip stacked structure 20 on the metal substrate 112 is sealed to expose the main surface 24*b* of the IF chip 24 of the chip stacked structure 20 which is distant from the metal substrate 112, and then the wiring board 38 is mounted on the main surface 24*b* of the exposed IF chip 24. Thus, a small semiconductor device 72 having high electric characteristics with a large capacity can be obtained due to the penetration electrodes 30. Further, an existing BGA assembly apparatus may be used.

Third Embodiment

FIGS. 23 to 26 are sectional views illustrating another manufacturing method of the semiconductor device according to the third embodiment. Since the process up to stacking the semiconductor chips is the same as in the third embodiment, detailed descriptions thereof will be omitted.

Figure 23:
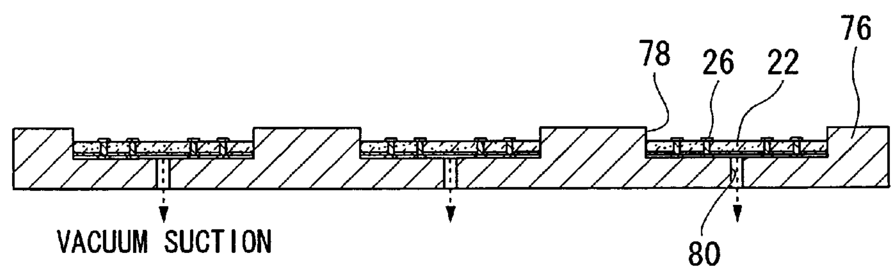
FIG. 23 is a cross sectional view illustrating a semiconductor device in a step involved in a method of forming the semiconductor device of FIG. 1 using the metal substrate of FIGS. 3A and 3B in accordance with a third embodiment of the present invention.

In the stacking process of the manufacturing process according to this embodiment, as shown in FIG. 23, the first DRAM chips 22 are accommodated in chip accommodating sections 78 of the jig 76 while the circuit forming surfaces 22*a* are directed toward the jig 76. As a vacuum suction opening section 80 is formed in each chip accommodating section 78 of the jig 76, and as vacuum suction is performed through the opening section 80 using a suction apparatus (not shown) or the like, the DRAM chip 22 which is accommodated in the chip accommodating section 78 is firmly supported.

Figure 24:
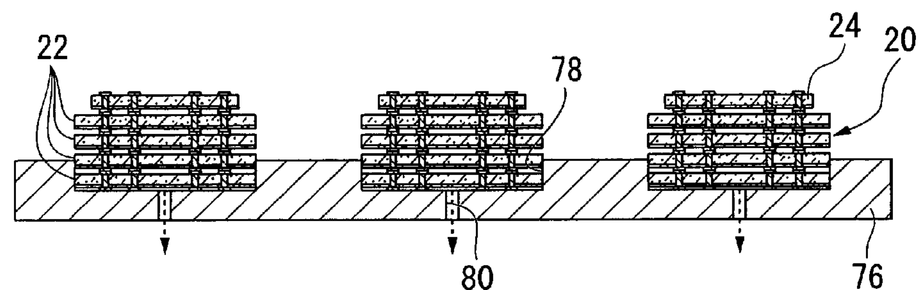
FIG. 24 is a cross sectional view illustrating a semiconductor device in a step subsequent to the step of FIG. 23, involved in the method of forming the semiconductor device of FIG. 1 using the metal substrate of FIGS. 3A and 3B.

Then, as the bump electrodes 28 corresponding to the second DRAM chip 22 are actually pressure-bonded to the bump electrodes 26 of the first DRAM chip 22 which is accommodated in the jig 78. The stacking and mounting is performed. Further, similar to the second DRAM chip 22, the third and fourth DRAM chips 22, and the IF chip 24 are sequentially stacked and mounted by the actual pressure-bonding. The chip stacked structures 20 are formed as shown in FIG. 24.

Figure 25:
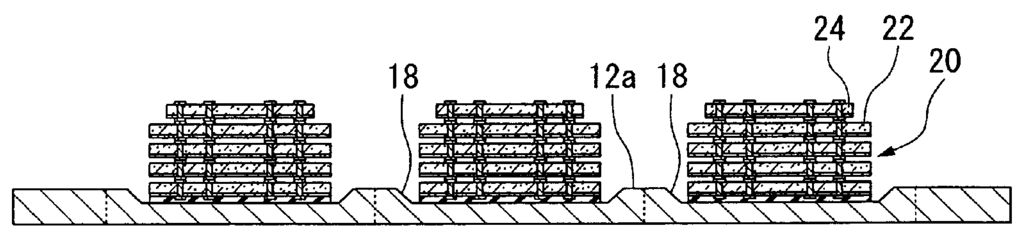
FIG. 25 is a cross sectional view illustrating a semiconductor device in a step subsequent to the step of FIG. 24, involved in a method of forming the semiconductor device of FIG. 1 using the metal substrate of FIGS. 3A and 3B.

Thereafter, the chip stacked structures 20 are taken out from the jig 78, and then are mounted in a batch on the chip mounting sections 14 of the metal substrate 12, as shown in FIG. 25. An insulating adhesive member or a DAF material 32 is adhered to the chip mounting sections 14 of the metal substrate 12, and the chip stacked structures 20 are adhesively fixed.

Similar to the first embodiment, the chip stacked structure sealing member 34 is supplied to a peripheral of each chip stacked structure 20 on the metal substrate 12. The supplied chip stacked structure sealing member 34 is filled in gaps between the semiconductor chips 22 and 24 according to a capillary tube phenomenon. Here, since the projecting member 18 having a sloped surface is formed on each chip mounting sections 14 of the metal substrate 12, flowing of the chip stacked structure sealing member 34 can be prevented by the projecting member 18. Further, since the spreading of the chip stacked structure sealing member 34 can be prevented, the fillet portion 34*a* of the chip stacked structure sealing member 34 can be stably formed around the chip stacked structure 20.

Figure 26:
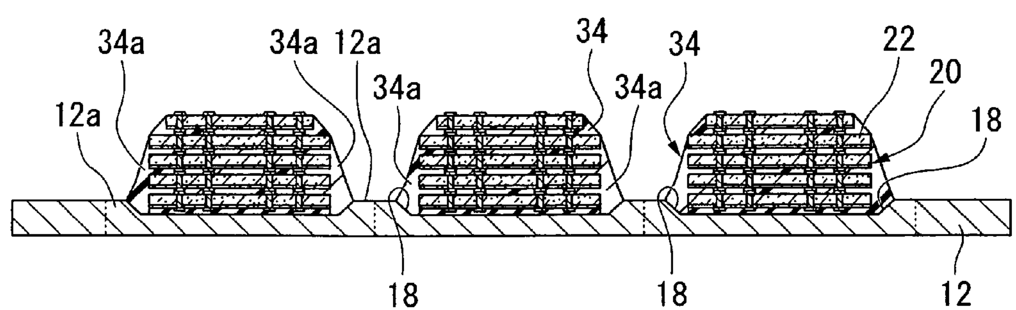
FIG. 26 is a cross sectional view illustrating a semiconductor device in a step subsequent to the step of FIG. 25, involved in the method of forming the semiconductor device of FIG. 1 using the metal substrate of FIGS. 3A and 3B.

Then, the metal substrate 12 having the chip stacked structure sealing member 34 is cured at a temperature of, for example, about 180° C. The chip stacked structure sealing member 34 is formed on the side surfaces of the chip stacked structure 20 of the metal substrate 12 and between the semiconductor chips, as shown in FIG. 26.

Thereafter, through the substrate dicing process, the semiconductor device as shown in FIGS. 1 and 2 can be manufactured.

In this embodiment, since the same effects as in the first embodiment can be obtained, and the chip stacked structures 20 can be formed using the jig 76 without temporary fixing, the chip stacked structures 20 can be mounted in a batch on the metal substrate 12, and the processing efficiency can be enhanced.

Further, in this embodiment, instead of the metal substrate 12 in the first embodiment, the chip stacked structures 20 may be mounted on the metal substrate 112 in the second embodiment.

Fourth Embodiment

Figure 27:
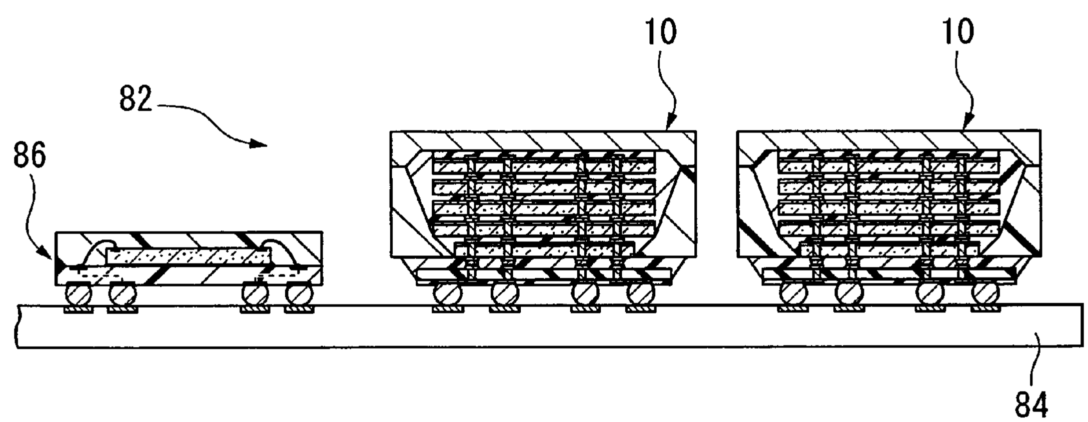
FIG. 27 is a sectional view illustrating an electronic device such as a memory module on which the semiconductor devices of FIGS. 1 and 2 are mounted in a fourth embodiment of the present invention.
Figure 28A:
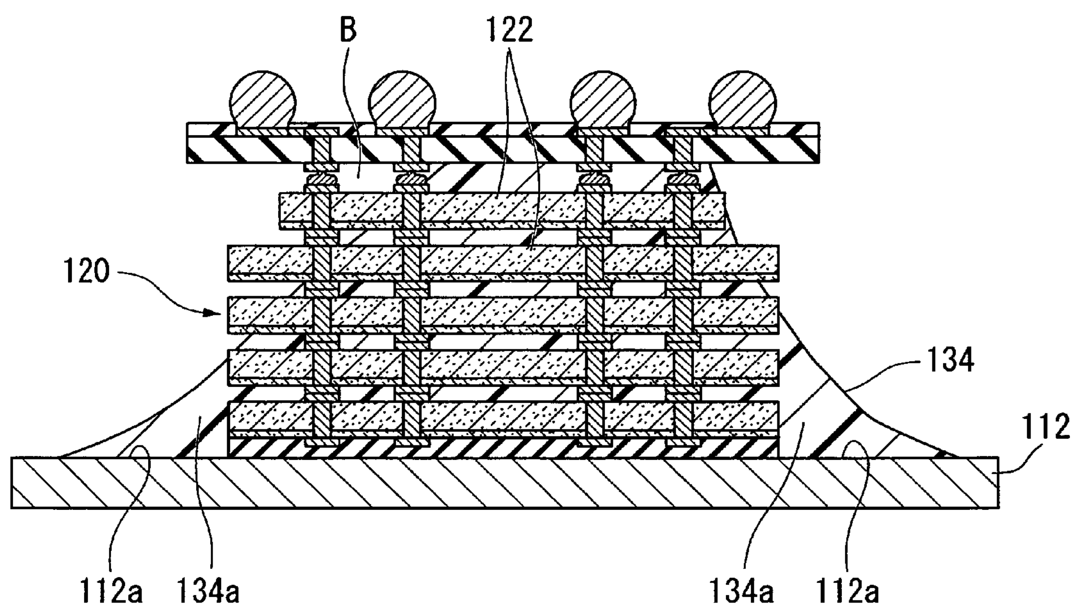
FIG. 28A is a cross sectional elevation view illustrating a semiconductor device in a step involved in a method of forming the semiconductor device in the related art.
Figure 28B:
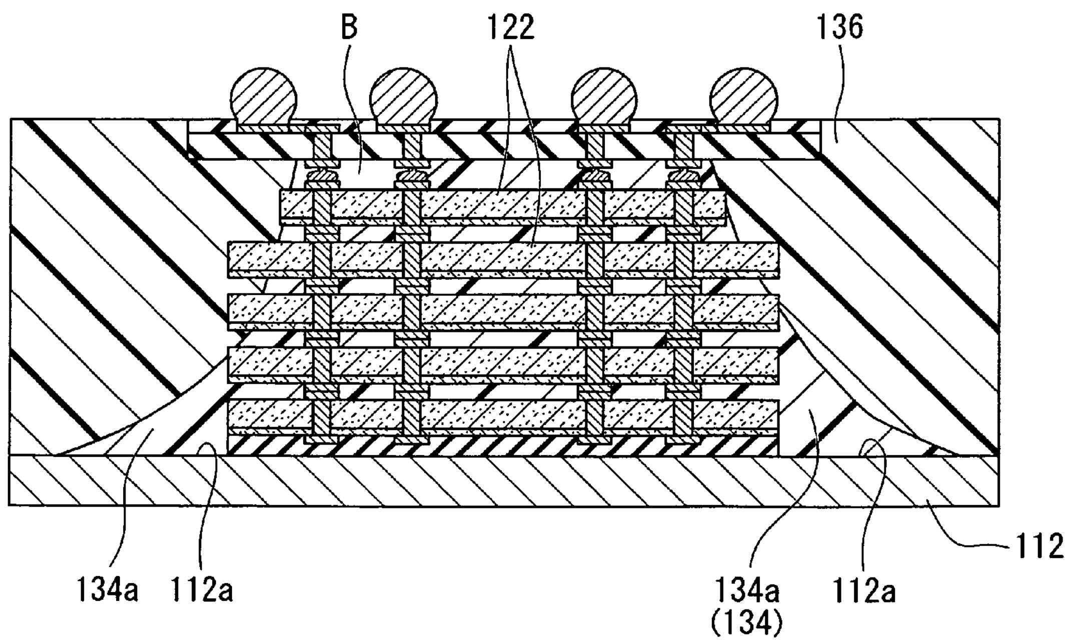
FIG. 28B is a cross sectional elevation view illustrating the semiconductor device in a step subsequent to the step of FIG. 28A, involved in a method of forming the semiconductor device in the related art.

FIG. 27 is a sectional view illustrating an electronic device such as a memory module on which the semiconductor devices of the first embodiment are mounted in a fourth embodiment of the present invention.

An electronic device 82 such as a memory module includes a module substrate (mounting substrate) 84 on which, for example, a predetermined wiring is formed, and the semiconductor device 10 having the configuration as described in the first embodiment is mounted in plurality on the module substrate 84, as shown in FIG. 27.

Further, a control semiconductor device 86 for controlling the plurality of semiconductor devices 10 is mounted on the module substrate 84. A connector section (not shown) is formed in an end part of the module substrate 84, and is connected to another electronic device by the connection section.

Since the small semiconductor devices 10 with large capacity are mounted on the mounting substrate 86 of the electronic device 82, the element mounting area of the electronic device 82 can be reduced. The electronic device 82 can be shrunken.

For the semiconductor device which is mounted on the electronic device 82, the semiconductor device 72 according to the second embodiment may be used.

As described above, these embodiments have been described, but since it is not necessary to form a separate sealing member in consideration of cutting locations for each of the plurality of chip mounting sections, it is not necessary to prepare a mold for every product.

When the chip stacked structure is formed of a chip which is not molded, for example, a chip in a pellet state or a chip in a bare state, since the chip stacked structure is susceptibly influenced due to voids generated when underfill material is filled for protection or the like of gaps between the stacked chips, the embodiments of the invention are especially effective.

In the embodiments, the chip stacked structure in which the DRAM chips and the IF chip are stacked through the penetration electrodes has been described, but a chip combination having any function, such as a combination of a memory chip and a logic chip as long as the chip stacked structure requires molding.

In this embodiment, four DRAM core chips and one IF chip are stacked, but the number of stacked layers may be two or more.

In this embodiment, the wiring board made of the polyimide base material, but a wiring board having other base materials such as a glass epoxy substrate may be used. Further, the BGA semiconductor device has been described, but the invention may be applied to other semiconductor devices such as Land Grid Array (LGA).

As used herein, the following directional terms “forward, rearward, above, downward, vertical, horizontal, below, and transverse” as well as any other similar directional terms refer to those directions of an apparatus equipped with the present invention. Accordingly, these terms, as utilized to describe the present invention should be interpreted relative to an apparatus equipped with the present invention.

The terms of degree such as “substantially,” “about,” and “approximately” as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:

a substrate comprising a chip mounting area and a higher-level portion, the higher level portion surrounding the chip mounting area, the higher-level portion being higher in level than the chip mounting area;

a stack of semiconductor chips disposed over the chip mounting area, the stack of the semiconductor chips including an uppermost semiconductor chip that is farthest from the substrate;

a first sealing material that seals the stack of semiconductor chips, the first sealing material being confined by the higher-level portion; and a second sealing material covering the stack of semiconductor chips and the first sealing material, so that a top surface of the uppermost semiconductor chip is exposed from the second sealing material, the top surface facing away from the substrate.

2. The semiconductor device according to claim 1, wherein the higher-level portion has a confining surface that confines a fillet portion of the first sealing material.

3. The semiconductor device according to claim 2, wherein the confining surface comprises at least one of a sloped surface and a vertical surface.

4. The semiconductor device according to claim 1, wherein the substrate comprises a lower-level portion having the chip mounting area and the higher-level portion, the higher-level portion surrounds the lower-level portion, the higher-level portion has a confining surface that confines the first sealing material.

5. The semiconductor device according to claim 4, wherein the higher-level portion is thicker than the lower-level portion.

6. The semiconductor device according to claim 4, wherein the higher-level portion comprises the same material as that of the lower-level portion.

7. The semiconductor device according to claim 1, wherein the higher-level portion comprises a projecting member which projects from a surface of the substrate.

8. The semiconductor device according to claim 7, wherein the projecting member comprises a material which is different from a material of the substrate.

9. The semiconductor device according to claim 1, wherein the higher-level portion has an outside edge that is aligned to an outside edge of the second sealing material.

10. The semiconductor device according to claim 1, further comprising:

a wiring board electrically connected to the stack of semiconductor chips, the stack of semiconductor chips being disposed between the wiring board and the substrate.

11. The semiconductor device according to claim 1, wherein the stack of semiconductor chips comprises semiconductor chips which each have through electrodes, and the semiconductor chips are electrically connected to each other via the through electrodes.

12. The semiconductor device according to claim 1, wherein the stack of semiconductor chips comprises a plurality of memory chips and an interface chip which controls the plurality of memory chips.

13. A semiconductor device comprising:

a metal substrate having a first flat surface and a confining surface;

a stack of semiconductor chips disposed over the flat surface via an insulating layer, the stack of the semiconductor chips being electrically insulated from the metal substrate;

a first sealing material that seals the stack of semiconductor chips, the first sealing material being confined by the confining surface; and a wiring substrate disposed over the stack of semiconductor chips, the wiring substrate being smaller in size than the metal substrate, the wiring substrate being electrically coupled to the stack of semiconductor chips.

14. The semiconductor device according to claim 13, wherein the confining surface comprises at least one of a sloped surface and a vertical surface.

15. The semiconductor device according to claim 14, wherein the metal substrate comprises a second flat surface which is connected through the confining surface to the first flat surface.

16. The semiconductor device according to claim 14, further comprising:

a second sealing material which covers the first sealing member and the second flat surface.

17. The semiconductor device according to claim 1, wherein the side surface of the higher-level portion comprises a sloped surface.

18. The semiconductor device according to claim 1, wherein each chip in the stack of semiconductor chips has a side surface that is covered by the first sealing material.

19. The semiconductor device according to claim 1, wherein the chip mounting area includes a thickness which is less than a thickness of the higher-level portion.

20. The semiconductor device according to claim 10, wherein the stack of the semiconductor chips comprises semiconductor chips which each have through electrodes, and the semiconductor chips are electrically connected to each other via the through electrodes.

21. The semiconductor device according to claim 13, wherein the stack of the semiconductor chips comprises semiconductor chips which each have through electrodes, and the semiconductor chips are electrically connected to each other via the through electrodes.

* * * * *